US012647077B2

(12) United States Patent
Hissen et al.

(10) Patent No.: US 12,647,077 B2
(45) Date of Patent: Jun. 2, 2026

(54) WIRELESS COMMUNICATION SYSTEM, POWER AMPLIFIER AND METHOD OF DETERMINING POWER AMPLIFIER PERFORMANCE

(71) Applicant: Bonsai Systems Inc., Vancouver (CA)

(72) Inventors: Jurgen Hissen, Port Moody (CA); Bernard Joseph Andre Guay, Vancouver (CA); Matthew William Mcadam, Vancouver (CA)

(73) Assignee: Bonsai Systems Inc., Vancouver (CA)

( * ) Notice: Subject to any disclaimer, the term of this patent is extended or adjusted under 35 U.S.C. 154(b) by 949 days.

(21) Appl. No.: 17/850,361

(22) Filed: Jun. 27, 2022

(65) Prior Publication Data

US 2023/0421118 A1 Dec. 28, 2023

(51) Int. Cl.
| | |
|---|---|
| *H03F 3/24* | (2006.01) |
| *H03F 1/32* | (2006.01) |
| *H04B 1/04* | (2006.01) |

(52) U.S. Cl.
CPC ............. *H03F 3/24* (2013.01); *H03F 1/3241* (2013.01); *H04B 1/0475* (2013.01);
(Continued)

(58) Field of Classification Search
CPC .... H03F 3/24; H03F 1/3241; H03F 2200/102; H03F 2200/451; H03F 2201/3215; H03F 2200/321; H03F 2200/462; H03F 2200/465; H03F 2200/468; H03F 2200/471; H03F 1/0266; H03F 1/0272; H03F 1/0288;
(Continued)

(56) References Cited

U.S. PATENT DOCUMENTS

| | | | |
|---|---|---|---|
| 5,204,637 | A | 4/1993 | Trinh |
| 8,331,487 | B2 | 12/2012 | Yu et al. |

(Continued)

FOREIGN PATENT DOCUMENTS

WO 0108259 A1 2/2001

OTHER PUBLICATIONS

Vasjanov., "A Review of Advanced CMOS RF Power Amplifier Architecture Trends for Low Power SG Wireless Networks," Electronics, 2018, pp. 1-17.

*Primary Examiner* — Hieu P Nguyen
(74) *Attorney, Agent, or Firm* — Borden Ladner Gervais LLP

(57) ABSTRACT

A wireless communication system includes a power amplifier (PA) configured to receive a radio frequency (RF) input signal and to produce a PA output signal, the PA output signal being an amplified version of the RF input signal. A sensor subsystem is configured to perform asynchronous statistical sampling of the RF input signal and of the PA output signal and to generate a sensor subsystem output. A controller, in communication with the sensor subsystem, is configured to obtain the sensor subsystem output and to infer performance of the PA, and may control one or more of a plurality of internal PA parameters. The controller may include a neural network processor to associate a particular statistical input/output characterization with a particular inferred performance for the PA. Compared to known approaches, the system is scalable and achieves lower power consumption, and is configured to obtain information about linearity performance.

45 Claims, 6 Drawing Sheets

(52) U.S. Cl.
CPC .. *H03F 2200/102* (2013.01); *H03F 2200/451* (2013.01); *H03F 2201/3215* (2013.01); *H04B 2001/0425* (2013.01)

(58) Field of Classification Search
CPC ....... H03F 3/195; H03F 3/245; H04B 1/0475; H04B 2001/0425
USPC ............. 330/126, 289, 149, 295, 124 R, 136
See application file for complete search history.

(56) References Cited

U.S. PATENT DOCUMENTS

| | | | |
|---|---|---|---|
| 8,351,877 B2 | 1/2013 | Kim et al. | |
| 8,995,936 B2 | 3/2015 | Desclos et al. | |
| 10,320,345 B2 | 6/2019 | Sharma et al. | |
| 11,159,187 B2 | 10/2021 | Papa et al. | |
| 2006/0217083 A1* | 9/2006 | Braithwaite | H03F 1/3282 |
| | | | 455/114.3 |
| 2008/0090539 A1 | 4/2008 | Thompson | |
| 2010/0271957 A1 | 10/2010 | Stapleton et al. | |
| 2018/0219563 A1 | 8/2018 | Tormanen et al. | |
| 2022/0360223 A1* | 11/2022 | Kultran | H03F 3/68 |
| 2023/0268942 A1* | 8/2023 | Ghannouchi | H04B 10/00 |
| | | | 375/297 |

* cited by examiner

WIRELESS COMMUNICATION SYSTEM, POWER AMPLIFIER AND METHOD OF DETERMINING POWER AMPLIFIER PERFORMANCE

FIELD

The present disclosure relates to electronic devices, including but not limited to systems, computing platforms, methods, and storage media for determining performance of a power amplifier.

BACKGROUND

Wireless communication systems are continuously evolving to keep up with data capacity and user experience demands. As a result, wireless systems have been transitioning to higher frequency bands where wider bandwidths are available. Many system implementations involve or use one or more radio frequency (RF) power amplifiers, referred to as MIMO or massive MIMO (multiple-input, multiple-output), to overcome channel propagation losses and/or improve spectral efficiency. This is especially true for systems operating at millimeter wave frequencies, and in these systems the number of power amplifiers can be large.

With an increase in the signal bandwidth, combined with an increase in complexity of the modulation schemes the power amplifiers have to deal with, there is a challenge in simultaneously achieving high-efficiency and meeting linearity requirements. Millimeter wave circuits operate at very high carrier frequencies and have issues with energy losses, and are very sensitive to the physical construction of each element, including on a chip, which similarly impacts the bandwidth and efficiency.

Some known approaches to improve power amplifier efficiency, such as Envelope Tracking (ET), or Digital Pre-distortion (DPD), do not scale to meet Massive MIMO and higher bandwidth requirements. Other power amplifier performance optimization approaches use prohibitively expensive external equipment to generate performance measurements. In other cases, they rely on very basic measurements such as temperature, DC currents and average power.

Improvements in approaches to wireless communication systems and associated power amplifiers are desirable.

BRIEF DESCRIPTION OF THE DRAWINGS

Embodiments of the present disclosure will now be described, by way of example only, with reference to the attached Figures.

DETAILED DESCRIPTION

Figure 1:
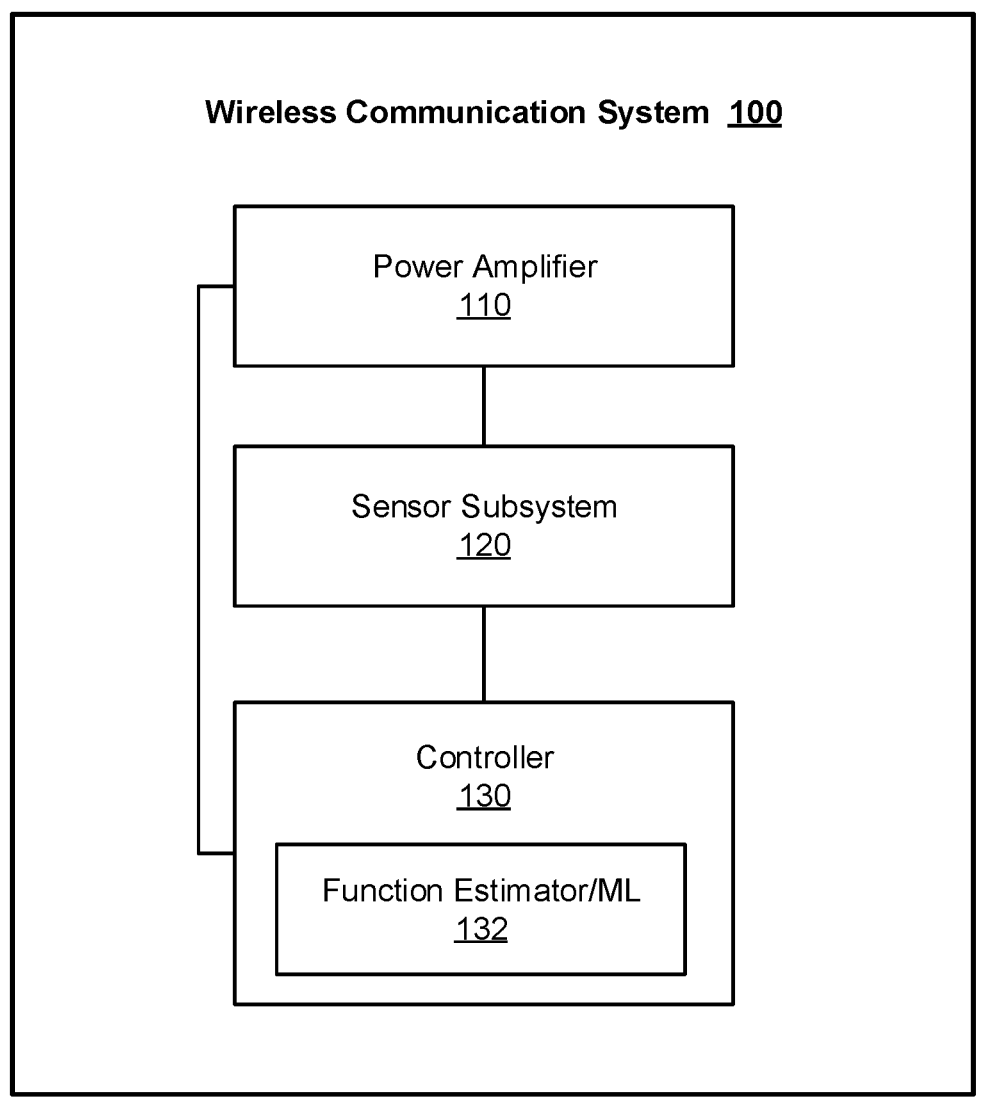
FIG. 1 is a block diagram illustrating a wireless communication system including a power amplifier and configured for determining power amplifier (PA) performance, in accordance with one or more embodiments.

A wireless communication system includes a power amplifier (PA) configured to receive a radio frequency (RF) input signal and to produce a PA output signal, the PA output signal being an amplified version of the RF input signal. A sensor subsystem is configured to perform asynchronous statistical sampling of the RF input signal and of the PA output signal and to generate a sensor subsystem output. A controller, in communication with the sensor subsystem, is configured to obtain the sensor subsystem output and to infer performance of the PA, and may control one or more of a plurality of internal PA parameters to optimize the performance of the PA. The controller may include a neural network processor to associate a particular statistical input/output characterization with a particular inferred performance for the PA. Compared to known approaches, the system is scalable and achieves lower power consumption, and is configured to obtain information about linearity performance and other metrics such as efficiency.

Some known approaches to improve PA efficiency while maintaining linearity, such as envelope tracking, or digital pre-distortion, do not scale to meet Massive MIMO and bandwidth requirements. Other approaches target in-situ optimization but use prohibitively expensive external equipment to generate performance measurements. In other cases, they rely on very basic measurements such as temperature, DC currents and average power, which can be done on-chip, but do not provide essential performance information. Embodiments of the present disclosure provide a power and cost efficient approach which, in an embodiment, may be implemented for each Power Amplifier in Massive MIMO systems. Massive MIMO systems utilize a large number of PA elements, which is made possible by the shorter wavelengths. As the number of power amplifier element grows, the power of each individual power amplifier is reduced, hence requiring very low power and cost overhead per PA. In addition, embodiments of the present disclosure do not suffer from bandwidth expansion or bandwidth limitations that are associated with known approaches.

Embodiments of the present disclosure provide an advanced system architecture including a power amplifier and a sensor subsystem. In an example implementation, the sensor subsystem measures the performance on chip in-situ. The system includes a controller, which may include a function estimator and which may be implemented as a neural network processor. The controller, or function estimator, takes the sensor output and is configured to infer performance metrics of the PA.

In contrast to some known approaches that use expensive external equipment, embodiments of the present disclosure provide performance measurement, with an architecture amenable to full integration on-chip. An apparatus may include, in some embodiments: integrated sensors which include the ability to derive information from RF signals; and/or integrated machine learning elements, for example using a neural network supervised-learning approach, to infer performance metrics.

In an embodiment, the present disclosure provides a wireless communication system comprising: a power amplifier configured to receive a radio frequency input signal and to produce a PA output signal, the PA output signal being an amplified version of the RF input signal; a sensor subsystem configured to perform asynchronous statistical sampling of the RF input signal and of the PA output signal and to generate a sensor subsystem output; and a controller, in communication with the sensor subsystem, configured to obtain the sensor subsystem output and to infer performance of the PA based on the sensor subsystem output.

In an example embodiment, the sensor subsystem is configured to simultaneously sample the PA output signal and the RF input signal.

In an example embodiment, the sensor subsystem is configured to determine a difference between the sample of the RF input signal and an attenuated version of the sample of the PA output signal.

In an example embodiment, the sensor subsystem is configured to generate the sensor subsystem output based on a statistical distribution of the difference between the sample of the RF input signal and the sample of the attenuated PA output signal.

In an example embodiment, the sensor subsystem is configured to generate the sensor subsystem output based on a probability density measurement of the difference between the sample of the RF input signal and the sample of the PA output signal.

In an example embodiment, the sensor subsystem is configured to perform asynchronous statistical sampling of the RF input signal and of the PA output signal at a sampling rate that is lower than the RF signal frequency.

In an example embodiment, the sensor subsystem is configured to perform asynchronous statistical sampling of the RF input signal and of the PA output signal at a sampling rate that is about 100 times lower than the RF signal frequency.

In an example embodiment, the sensor subsystem is configured to perform asynchronous statistical sampling to extract and preserve only a subset of the RF input signal and of the PA output signal.

In an example embodiment, the sensor subsystem is configured to perform asynchronous statistical sampling to extract data relating to linearity and to determine statistical distribution of an amplitude of the RF input signal and the PA output signal.

In an example embodiment, the sensor subsystem is configured to perform asynchronous statistical sampling to obtain distributions of amplitude and phase of the RF input signal and the PA output signal to determine linearity performance.

In an example embodiment, the sensor subsystem is configured to measure one or more non-RF characteristics associated with the PA, and to generate the sensor subsystem output based on one or more of the RF input, the PA output and the one or more non-RF characteristics. In an example embodiment, the one or more non-RF characteristics comprise one or more of: temperature, supply voltage, average supply current, average output current, output power and signal envelope.

In an example embodiment, the sensor subsystem comprises one or more integrated sensors co-located with the PA. In an example embodiment, the wireless communication system comprises an on-chip system, and wherein the one or more integrated sensors are co-located with the PA on-chip.

In an example embodiment, the controller comprises a function estimator. In an example embodiment, the function estimator comprises one or more integrated machine learning (ML) elements configured to infer performance metrics associated with the PA.

In an example embodiment, the function estimator comprises a neural network processor configured to implement a neural network supervised-learning performance estimation method.

In an example embodiment, the neural network processor is pre-trained to associate a particular statistical input/output characterization with a particular inferred performance for the PA.

In an example embodiment, the neural network processor and the sensor subsystem cooperate to create a plurality of statistical input/output characterizations and to train the neural network processor to associate a particular statistical input/output characterization with a particular inferred performance for the PA.

In an example embodiment, the neural network processor is trained to generate a first inferred performance for the PA based on a first statistical input/output characterization, which is based on the sensor subsystem output, and based on training data.

In an example embodiment, the controller is configured to control internal elements of the power amplifier.

In an example embodiment, the controller is configured to provide performance information associated with the inferred performance of the PA to the system.

In an example embodiment, the controller is configured to generate an inferred PA performance indicator based on the inferred performance of the PA. In an example embodiment, the generated performance indicator comprises a value or a performance category. In an example embodiment, generating the performance indicator may comprise one or more of: generating a performance indication signal embedding performance indication data; generating performance indication data; and/or generating a visual performance indicator.

In an example embodiment, wherein the PA comprises a reconfigurable PA including: a plurality of independently controllable amplifying elements having associated therewith a plurality of internal control parameters; and wherein the controller is in communication with the plurality of independently controllable amplifying elements and configured to control one or more of the plurality of internal control parameters such that the PA is an internally reconfigurable PA.

In an example embodiment, performance of the PA is based on a combination of contributions from the plurality of independently controllable amplifying elements.

In an example embodiment, the plurality of independently controllable PA elements comprise an independently controllable first PA element having a first internal PA parameter and an independently controllable second PA element having a second internal PA parameter; and the controller is configured to control one or more of the first internal PA parameter and the second internal PA parameter.

In an example embodiment, the controller is configured to concurrently optimize performance of the PA with respect to the plurality of internal PA parameters.

In an example embodiment, the controller is configured to concurrently optimize performance of the PA with respect to linearity, efficiency and reliability.

In an example embodiment, the controller comprises one or more integrated machine learning elements configured to modify one or more of the plurality of internal control parameters based on inferred performance metrics associated with the PA.

In an example embodiment, the one or more integrated ML elements are configured to perform multivariate optimization with respect to the plurality of internal PA control parameters.

In an example embodiment, the one or more integrated ML elements are configured to perform multivariate optimization with respect to a subset of the plurality of internal PA parameters.

In an example embodiment, the one or more integrated ML elements comprise a neural network that is pre-trained to determine how to control a selected internal PA parameter from among the plurality of internal PA parameters.

In an example embodiment, the neural network is pre-trained to determine whether the selected internal PA parameter is to be increased or decreased.

In an example embodiment, the one or more integrated ML elements comprise a neural network that is pre-trained to determine how to control a selected internal PA parameter from among the plurality of internal PA parameters, and that is configured to be continuously trained to provide a recommended control modification based on one or more detected performance measures.

In an example embodiment, the one or more integrated ML elements comprise a neural network which is configured to be trained on-chip to provide a recommended control modification based on one or more detected performance measures.

In an example embodiment, the RF input signal is unpre-processed with respect to compensation for PA distortion.

In an example embodiment, the plurality of independently controllable PA elements are implemented in an integrated circuit.

In an example embodiment, the controller is implemented in the integrated circuit.

In an embodiment, the present disclosure provides a processor-implemented method for processing instructions associated with one or more data transfers, the method comprising: receiving, at a power amplifier (PA), a radio frequency (RF) input signal; producing, at the PA, a PA output signal, the PA output signal being an amplified version of the RF input signal; performing, via a sensor subsystem, asynchronous statistical sampling of the RF input signal and of the PA output signal and to generate a sensor subsystem output; and obtaining, via a controller in communication with the sensor subsystem, the sensor subsystem output and inferring performance of the PA based on the sensor subsystem output.

In an example embodiment, the method further comprises generating, via the controller, an inferred PA performance indicator based on the inferred performance of the PA.

In an embodiment, the present disclosure provides an apparatus comprising: a non-transient computer-readable storage medium having executable instructions embodied thereon; and one or more hardware processors configured to execute the instructions to: receive a radio frequency (RF) input signal and to produce a PA output signal, the PA output signal being an amplified version of the RF input signal; perform asynchronous statistical sampling of the RF input signal and of the PA output signal and to generate a sensor subsystem output; and obtain the sensor subsystem output and to infer performance of the PA.

In another embodiment, the present disclosure provides a wireless communication system comprising: a power amplifier configured to receive a radio frequency input signal and to produce a PA output signal, the PA output signal being an amplified version of the RF input signal; a sensor subsystem configured to perform sampling of the RF input signal and of the PA output signal and to generate a sensor subsystem output; and a controller, in communication with the sensor subsystem, comprising one or more integrated machine learning elements and configured to obtain the sensor subsystem output and to infer performance metrics associated with the PA based on the obtained sensor subsystem output the controller.

In an example embodiment, the controller is configured to generate an inferred PA performance indicator based on the inferred performance of the PA.

In a further embodiment, the present disclosure provides a power amplifier comprising: a plurality of independently controllable PA elements having associated therewith a plurality of internal PA parameters, each of the plurality of independently controllable PA elements having a respective internal PA parameter; and a controller, in communication with the plurality of independently controllable PA elements, configured to control one or more of the plurality of internal PA parameters such that the PA is an internally reconfigurable PA.

In another embodiment, the present disclosure provides a wireless communication system comprising: a power amplifier configured to receive a radio frequency input signal and to produce a PA output signal, the PA output signal being an amplified version of the RF input signal; a sensor subsystem configured to perform sampling of the RF input signal and of the PA output signal and to generate a sensor subsystem output; and a controller, in communication with the sensor subsystem, comprising one or more integrated machine learning elements and configured to obtain the sensor subsystem output and to infer performance metrics associated with the PA based on the obtained sensor subsystem output the controller.

For the purpose of promoting an understanding of the principles of the disclosure, reference will now be made to the features illustrated in the drawings and specific language will be used to describe the same. It will nevertheless be understood that no limitation of the scope of the disclosure is thereby intended. Any alterations and further modifications, and any further applications of the principles of the disclosure as described herein are contemplated as would normally occur to one skilled in the art to which the disclosure relates. It will be apparent to those skilled in the relevant art that some features that are not relevant to the present disclosure may not be shown in the drawings for the sake of clarity.

Certain terms used in this application and their meaning as used in this context are set forth in the description below. To the extent a term used herein is not defined, it should be given the broadest definition persons in the pertinent art have given that term as reflected in at least one printed publication or issued patent. Further, the present processes are not limited by the usage of the terms shown below, as all equivalents, synonyms, new developments and terms or processes that serve the same or a similar purpose are considered to be within the scope of the present disclosure.

FIG. 1 is a block diagram illustrating a wireless communication system 100 including a power amplifier and configured for determining power amplifier performance, in accordance with one or more embodiments. In an implementation, the system 100 comprises a smart power amplifier. The wireless communication system 100 comprises a power amplifier (PA) 110 configured to receive a radio frequency (RF) input signal and to produce a PA output signal. The PA output signal is an amplified version of the RF input signal. A sensor subsystem 120 is in communication with the PA 110 and configured to perform asynchronous statistical sampling of the RF input signal and of the PA output signal. The sensor subsystem 120 is also configured to generate a sensor subsystem output.

A controller 130 is in communication with the sensor subsystem 120, and configured to obtain the sensor subsystem output and to infer performance of the PA 110. The system 100 infers performance of the PA 100, rather than taking one or more performance measurements, since such measurements can be costly and require specialized equipment, which often needs to be external equipment, for example which cannot be provided locally with the PA.

The sensor subsystem 120 is configured to perform asynchronous statistical sampling of the RF input signal and of the PA output signal. In performing asynchronous statistical sampling, the sensor subsystem 120 is not trying to synchronize the statistical sampling with the signal, and may just take snapshots of the signal. This is in contrast to known approaches, which typically sample uniformly like clockwork at specific points in time. In an implementation, the sensor subsystem 120. This may be described as performing non-uniform statistical sampling of the RF input signal and of the PA output signal.

In an embodiment, the sensor subsystem 120 is configured to simultaneously sample the PA output signal and the RF input signal. In an implementation, simultaneous sampling refers to sampling both the RF input signal and the PA output signal in a manner that accounts for the delay in the PA, so that the samples are considered to be simultaneous. For example, if the PA introduces a delay D, in an embodiment the sensor subsystem 120 would sample the RF input signal at a time T, and would sample the PA output signal at a time T+D, resulting in simultaneous sampling, and may comprise simultaneous asynchronous statistical sampling.

In an embodiment, the sensor subsystem 120 is configured to determine a difference between the sample of the RF input signal and the attenuated sample of the PA output signal. In an embodiment, the output is an amplified version of the input. If the output is attenuated by the inverse of the gain, the output is equal to the input in the absence of distortion and noise.

Accordingly, it may be advantageous to determine the difference between the sample of the RF input signal and an attenuated version of the sample of the PA output signal. In an embodiment, the sensor subsystem 120 is configured to generate the sensor subsystem output based on a statistical distribution of the difference between the sample of the RF input signal and the attenuated sample of the PA output signal. In another embodiment, the sensor subsystem 120 is configured to generate the sensor subsystem output based on a probability density measurement of the difference between the sample of the RF input signal and the sample of the PA output signal.

In an embodiment, the sensor subsystem 120 is configured to perform asynchronous statistical sampling of the RF input signal and of the PA output signal at a sampling rate that is lower than the RF signal frequency. In an embodiment, the sensor subsystem 120 is configured to perform asynchronous statistical sampling of the RF input signal and of the PA output signal at a sampling rate that is about 100 times lower than the RF signal frequency.

Consider a known approach that uses Nyquist sampling of 2 times the highest frequency component of the signal being sampled. Nyquist sampling is a uniform sampling vs time, with a sampling frequency sufficient to capture all frequency components of the signal.

This is normally 2× the highest frequency component of the signal being sampled. In an implementation in which the signals are about 28 GHz, the Nyquist sampling is at about 56 GHz. This can be very power hungry for high-frequency signals. Another known approach uses uniform sub-sampling where the sampling rate would be 2× the RF signal bandwidth (as opposed to carrier frequency), for example 2×1 GHz, which would still be very expensive.

According to an embodiment of the present disclosure, by performing asynchronous statistical sampling, sampling is performed at a much lower rate, and this can be done at a much lower power consumption, providing an improvement in the functioning of the PA. In an example embodiment of the present disclosure, the system may sample at a rate the in 100s of MHz, and may be even lower, and it accumulates statistics over time. The asynchronous statistical sampling rate according to an embodiment of the present disclosure may be a factor of 100 lower than the RF input signal frequency, which may be in the GHz range.

Rather than doing full Nyquist sampling, which preserves all of the information, an example embodiment of the present disclosure samples at a much lower or slower rate, and obtains and observes data in a different way. In an example implementation, the system does not use all of the data in the system, but rather extracts specific information. Statistical sampling intentionally does not provide the ability to reconstruct the signal from the sample, such that some information is lost compared to Nyquist sampling.

For example, the sensor subsystem 120 may be configured to perform asynchronous statistical sampling which comprises extracting specific information associated with the linearity and the statistical distribution of the amplitude of the signal. In an example implementation, the system considers certain distributions of amplitude and phase of the signal, for example to determine the linearity performance. In an example implementation, the system is simultaneously sampling the input and the output and comparing them, which provides the correlation to linearity.

In an embodiment, the sensor subsystem 120 is configured to perform asynchronous statistical sampling to extract and preserve only a subset of the RF input signal and of the PA output signal. In an embodiment, the sensor subsystem 120 is configured to perform asynchronous statistical sampling to extract data relating to linearity and to determine statistical distribution of an amplitude of the RF input signal and the PA output signal. In an embodiment, the sensor subsystem 120 is configured to perform asynchronous statistical sampling to obtain distributions of amplitude and phase of the RF input signal and the PA output signal to determine linearity performance.

In an embodiment, the sensor subsystem 120 is configured to measure one or more non-RF characteristics associated with the PA. In such an implementation, the sensor subsystem 120 is configured to generate the sensor subsystem output based on one or more of: the RF input, the PA output and the one or more non-RF characteristics. In an example embodiment, the one or more non-RF characteristics comprise one or more of: temperature, supply voltage, average supply current, average output current, output power and signal envelope.

In an embodiment, the sensor subsystem 120 comprises one or more integrated sensors co-located with the PA 110. In an example embodiment, the wireless communication system 100 comprises an on-chip system, and the one or more integrated sensors are co-located with the PA 110 on-chip. In an embodiment, the one or more integrated sensors are provided as an on-chip sensor subsystem to measure power amplifier performance in-situ with very low overhead power consumption.

In an embodiment, the controller 130 comprises one or more controller elements co-located with the PA 110. In an example embodiment, the wireless communication system 100 comprises an on-chip system, and the controller 130 is co-located with the PA 110 on-chip.

In an embodiment, the controller 130 comprises a function estimator 132, or regressor, which outputs a continuous value. In an embodiment, the controller 130 comprises a classifier, which outputs a predicted class (e.g. very good, good, bad, very bad). In an example embodiment, the function estimator 132 comprises a neural network processor. In an example embodiment, the function estimator 132 comprises one or more integrated machine learning (ML) elements configured to infer performance metrics associated with the PA 110. In some embodiments, the ML and neural network components may accomplish other functions than a function estimator, for example a classifier.

In an embodiment, the ML elements are configured to infer the actual performance of the power amplifier, not just react to the knowledge of a measured value, such as a measured temperature. For example, in contrast to known approaches that may include a power detector at the output, such a known power detector only provides an indication of the detected power. In contrast, embodiments of the present disclosure infer performance and, based on that inferred performance, may determine if it is linear or distorted, which is not possible using known approaches. According to one or more embodiments, having this performance estimation enables the implementation of in-situ performance optimization, hence it has very high value.

In an example embodiment, the function estimator 132 comprises a neural network (NN) processor configured to implement a neural network supervised-learning performance estimation method. In an example embodiment, the neural network processor is pre-trained to associate a particular statistical input/output characterization with a particular inferred performance for the PA. In another example embodiment, the neural network processor and the sensor subsystem cooperate to create a plurality of statistical input/output characterizations and to train the neural network processor to associate a particular statistical input/output characterization with a particular inferred performance for the PA.

For example, the NN processor may be trained to generate a first inferred performance for the PA based on a first statistical input/output characterization, which is based on the sensor subsystem output, and based on training data. The NN processor and the inferring of PA performance may be considered parallel to image recognition, but in this case the "image" is the statistical distributions, which is a novel approach and implementation.

In an example embodiment, the neural network or the function approximator may be provided on-chip with the power amplifier and the sensors; shared between a plurality of power amplifiers; and/or configured to process sensor outputs and infer its performance metrics.

In an example embodiment, the controller 130 is configured to provide performance information associated with the inferred performance of the PA to the system. In an example embodiment, the controller 130 is configured to control internal elements of the power amplifier 110.

Example embodiments have been described above in relation to asynchronous statistical sampling.

In another embodiment, the sensor subsystem 120 is in communication with the PA 110 and configured to perform sampling of the RF input signal and of the PA output signal, and to generate a sensor subsystem output. In this embodiment, the sampling can be any method of sampling, and need not be asynchronous statistical sampling, as recited above, but may employ any type of sampling, including Nyquist or asynchronous statistical sampling. In this embodiment, the controller 130 is in communication with the sensor subsystem 120, and configured to obtain the sensor subsystem output. The controller 130 comprises one or more integrated machine learning (ML) elements which are applied to the sensor subsystem output and configured to infer performance metrics associated with the PA, and optionally to generate a PA performance indicator. The method of sampling used in this embodiment is combined with the ML elements applied to the sensor subsystem output to infer performance metrics associated with the PA. This provides advantages over known approaches, without requiring the asynchronous statistical sampling method.

Figure 2:
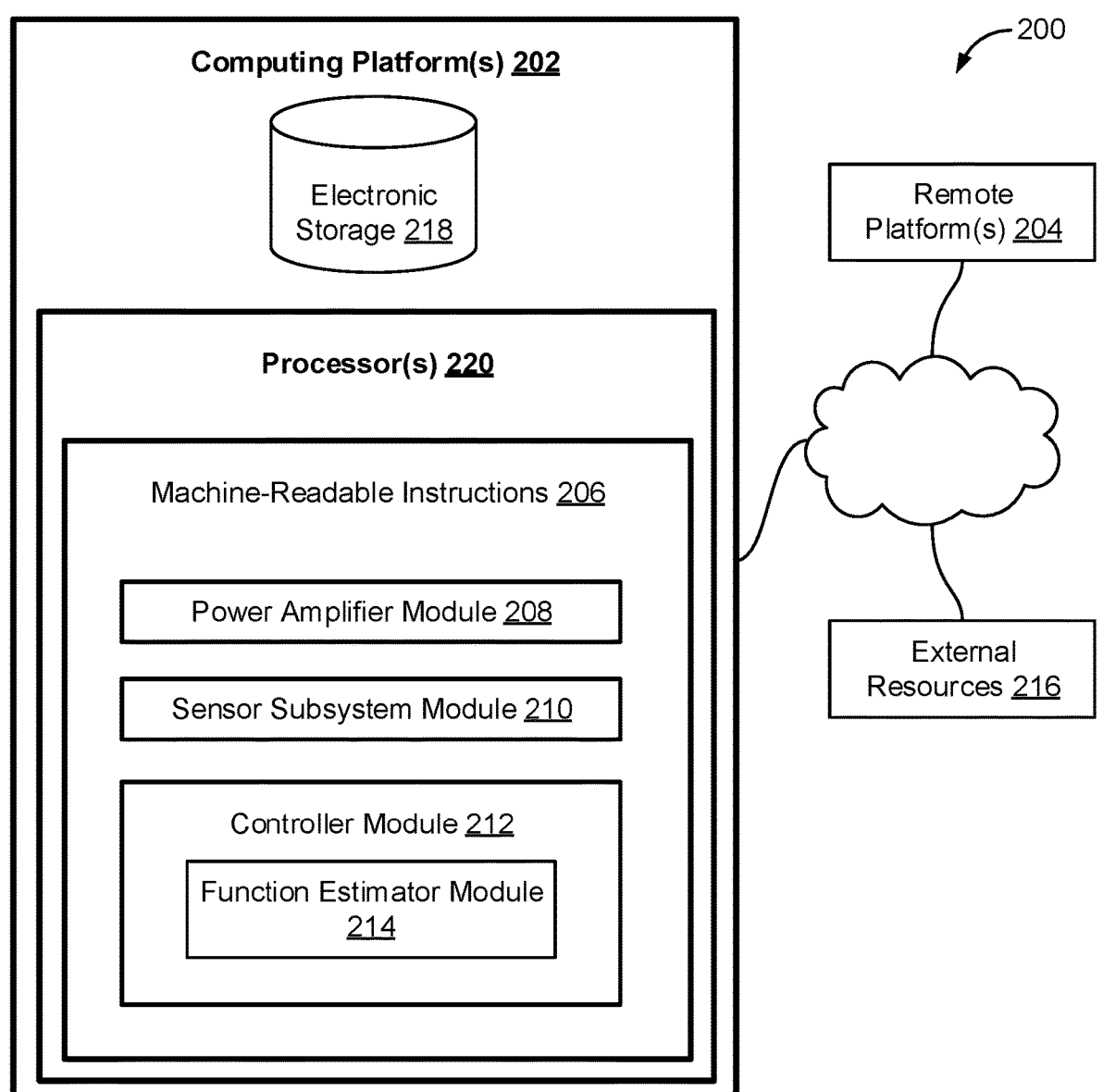
FIG. 2 illustrates a system for determining power amplifier performance, in accordance with one or more embodiments.

FIG. 2 illustrates a system 200 for determining power amplifier performance, in accordance with one or more embodiments. The embodiment of FIG. 1 illustrates a system in a generic block diagram form, which may be implemented in one products and at one location, for example with all of the elements being on-chip. The embodiment of FIG. 2 illustrates that some functionality may be distributed, or provided as modules.

In some embodiments, system 200 may include one or more computing platforms 202. Computing platform(s) 202 may be configured to communicate with one or more remote platforms 204 according to a client/server architecture, a peer-to-peer architecture, and/or other architectures. Remote platform(s) 204 may be configured to communicate with other remote platforms via computing platform(s) 202 and/or according to a client/server architecture, a peer-to-peer architecture, and/or other architectures. Users may access system 200 via remote platform(s) 204.

Computing platform(s) 202 may be configured by machine-readable instructions 206. Machine-readable instructions 206 may include one or more instruction modules. The instruction modules may include computer program modules. The instruction modules may include one or more of power amplifier module 208, sensor subsystem module 210, controller module 212, function estimator module 214, and/or other instruction modules.

Power amplifier module 208 may be configured to receive an RF input signal, and to produce a PA output signal, the PA output signal being an amplified version of the RF input signal.

Sensor subsystem module 210 may be configured to perform asynchronous statistical sampling of the RF input signal and of the PA output signal and to generate a sensor subsystem output.

Controller module 212 may be configured to obtain the sensor subsystem output from the sensor subsystem module 210 and to infer performance of the PA to generate a PA performance indicator. Controller module 212 may comprise function estimator module 214, which may comprise one or more integrated machine learning elements configured to infer performance metrics associated with the PA. Function estimator module 214 may comprise a neural network processor configured to implement a neural network supervised-learning performance estimation method.

In one or more embodiments, one or more of the features and characteristics described above in relation to the power amplifier 110 may also be applied to the power amplifier module 208. In one or more embodiments, one or more of the features and characteristics described above in relation to the sensor subsystem 120 may also be applied to the sensor subsystem module 210. In one or more embodiments, one or more of the features and characteristics described above in relation to the controller 130 may also be applied to the controller module 212.

In some embodiments, computing platform(s) 202, remote platform(s) 204, and/or external resources 216 may be operatively linked via one or more electronic communication links. For example, such electronic communication links may be established, at least in part, via a network such as the Internet and/or other networks. It will be appreciated that this is not intended to be limiting, and that the scope of this disclosure includes implementations in which computing platform(s) 202, remote platform(s) 204, and/or external resources 216 may be operatively linked via some other communication media.

A given remote platform 204 may include one or more processors configured to execute computer program modules. The computer program modules may be configured to enable an expert or user associated with the given remote platform 204 to interface with system 200 and/or external resources 216, and/or provide other functionality attributed herein to remote platform(s) 204. By way of non-limiting example, a given remote platform 204 and/or a given computing platform 202 may include one or more of a server, a desktop computer, a laptop computer, a handheld computer, a tablet computing platform, a NetBook, a Smartphone, a gaming console, and/or other computing platforms.

External resources 216 may include sources of information outside of system 200, external entities participating with system 200, and/or other resources. In some embodiments, some or all of the functionality attributed herein to external resources 216 may be provided by resources included in system 200.

Computing platform(s) 202 may include electronic storage 218, one or more processors 220, and/or other components. Computing platform(s) 202 may include communication lines, or ports to enable the exchange of information with a network and/or other computing platforms. Illustration of computing platform(s) 202 in FIG. 2 is not intended to be limiting. Computing platform(s) 202 may include a plurality of hardware, software, and/or firmware components operating together to provide the functionality attributed herein to computing platform(s) 202. For example, computing platform(s) 202 may be implemented by a cloud of computing platforms operating together as computing platform(s) 202.

Electronic storage 218 may comprise non-transitory storage media that electronically stores information. The electronic storage media of electronic storage 218 may include one or both of system storage that is provided integrally (i.e., substantially non-removable) with computing platform(s) 202 and/or removable storage that is removably connectable to computing platform(s) 202 via, for example, a port (e.g., a USB port, a firewire port, etc.) or a drive (e.g., a disk drive, etc.). Electronic storage 218 may include one or more of optically readable storage media (e.g., optical disks, etc.), magnetically readable storage media (e.g., magnetic tape, magnetic hard drive, floppy drive, etc.), electrical charge-based storage media (e.g., EEPROM, RAM, etc.), solid-state storage media (e.g., flash drive, etc.), and/or other electronically readable storage media. Electronic storage 218 may include one or more virtual storage resources (e.g., cloud storage, a virtual private network, and/or other virtual storage resources). Electronic storage 218 may store software algorithms, information determined by processor(s) 220, information received from computing platform(s) 202, information received from remote platform(s) 204, and/or other information that enables computing platform(s) 202 to function as described herein.

Processor(s) 220 may be configured to provide information processing capabilities in computing platform(s) 202.

As such, processor(s) 220 may include one or more of a digital processor, an analog processor, a digital circuit designed to process information, an analog circuit designed to process information, a state machine, and/or other mechanisms for electronically processing information. Although processor(s) 220 is shown in FIG. 2 as a single entity, this is for illustrative purposes only. In some embodiments, processor(s) 220 may include a plurality of processing units. These processing units may be physically located within the same device, or processor(s) 220 may represent processing functionality of a plurality of devices operating in coordination. Processor(s) 220 may be configured to execute modules 208, 210, 212, and/or 214, and/or other modules. Processor(s) 220 may be configured to execute modules 208, 210, 212, and/or 214, and/or other modules by software; hardware; firmware; some combination of software, hardware, and/or firmware; and/or other mechanisms for configuring processing capabilities on processor(s) 220. As used herein, the term "module" may refer to any component or set of components that perform the functionality attributed to the module. This may include one or more physical processors during execution of processor readable instructions, the processor readable instructions, circuitry, hardware, storage media, or any other components.

It should be appreciated that although modules 208, 210, 212 and/or 214 are illustrated in FIG. 2 as being implemented within a single processing unit, in embodiments in which processor(s) 220 includes multiple processing units, one or more of modules 208, 210, 212 and/or 214 may be implemented remotely from the other modules. The description of the functionality provided by the different modules 208, 210, 212, and/or 214 described below is for illustrative purposes, and is not intended to be limiting, as any of modules 208, 210, 212, and/or 214 may provide more or less functionality than is described. For example, one or more of modules 208, 210, 212, and/or 214 may be eliminated, and some or all of its functionality may be provided by other ones of modules 208, 210, 212, and/or 214. As another example, processor(s) 220 may be configured to execute one or more additional modules that may perform some or all of the functionality attributed below to one of modules 208, 210, 212, and/or 214.

Figure 3:
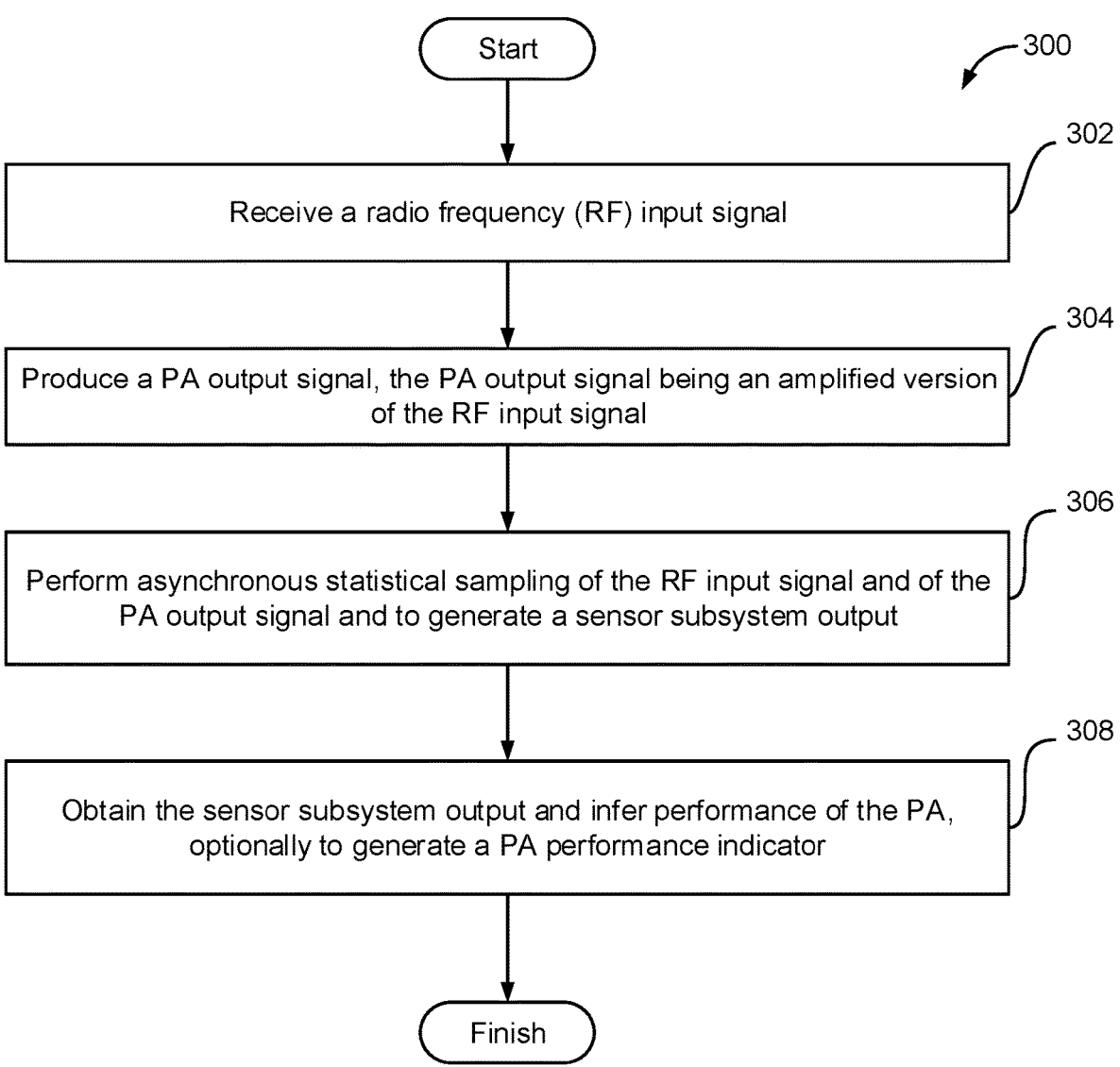
FIG. 3 illustrates a method for determining power amplifier performance, in accordance with one or more embodiments.

FIG. 3 illustrates a method 300 for determining or inferring power amplifier performance, in accordance with one or more embodiments. The operations of method 300 presented below are intended to be illustrative. In some embodiments, method 300 may be accomplished with one or more additional operations not described, and/or without one or more of the operations discussed. Additionally, the order in which the operations of method 300 are illustrated in FIG. 3 and described below is not intended to be limiting.

In some embodiments, method 300 may be implemented in one or more processing devices (e.g., a digital processor, an analog processor, a digital circuit designed to process information, an analog circuit designed to process information, a state machine, and/or other mechanisms for electronically processing information). The one or more processing devices may include one or more devices executing some or all of the operations of method 300 in response to instructions stored electronically on an electronic storage medium. The one or more processing devices may include one or more devices configured through hardware, firmware, and/or software to be specifically designed for execution of one or more of the operations of method 300.

An operation 302 may include receiving a radio frequency (RF) input signal. Operation 302 may be performed by a power amplifier, such as PA 110 in FIG. 1, or by one or more hardware processors configured by machine-readable instructions including a module that is the same as or similar to power amplifier module 208 in FIG. 2, in accordance with one or more embodiments.

An operation 304 may include producing a PA output signal, the PA output signal being an amplified version of the RF input signal. Operation 304 may be performed by a power amplifier, such as PA 110 in FIG. 1, or by one or more hardware processors configured by machine-readable instructions including a module that is the same as or similar to power amplifier module 208, in accordance with one or more embodiments.

An operation 306 may include performing asynchronous statistical sampling of the RF input signal and of the PA output signal and to generate a sensor subsystem output. Operation 306 may be performed by a sensor subsystem 120 such as shown in FIG. 1, or by one or more hardware processors configured by machine-readable instructions including a module that is the same as or similar to sensor subsystem module 210, in accordance with one or more embodiments.

An operation 308 may include obtaining the sensor subsystem output and inferring performance of the PA, for example to generate a PA performance indicator. Generating the performance indicator may comprise one or more of: generating a performance indication signal embedding performance indication data; generating performance indication data, such as a value or a performance category; and/or generating a visual performance indicator, which may include a value and/or a performance category. Operation 308 may be performed by a controller 130, such as shown in FIG. 1, in communication with the sensor subsystem 120. Operation 308 may be performed by one or more hardware processors configured by machine-readable instructions including a module that is the same as or similar to controller module 212 and/or function estimator module 214, in accordance with one or more embodiments.

Figure 4:
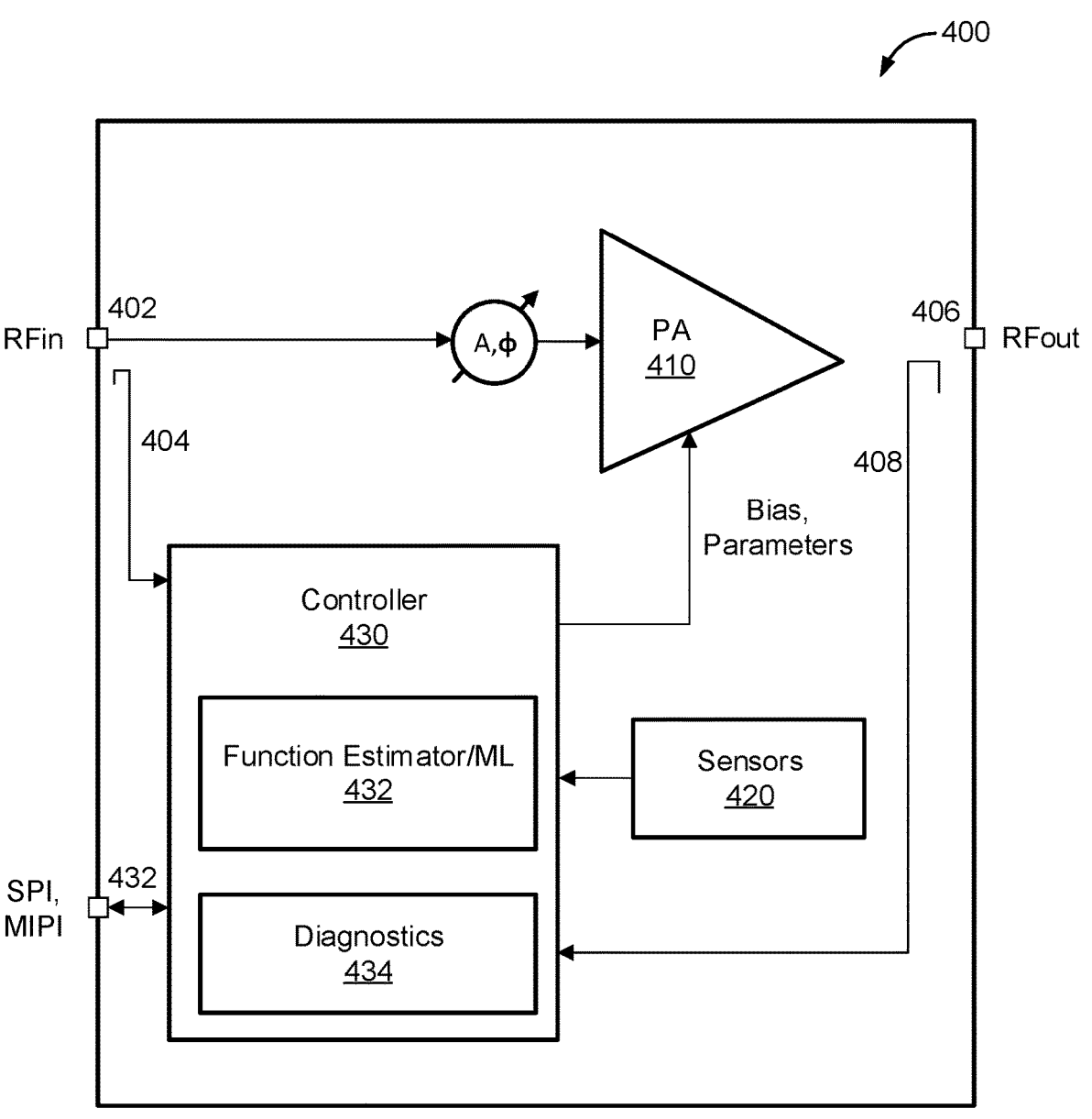
FIG. 4 is a functional block diagram illustrating an apparatus, in accordance with one or more embodiments, such as a smart power amplifier.

FIG. 4 is a functional block diagram illustrating an apparatus 400 configured for determining power amplifier performance, in accordance with one or more embodiments. The apparatus 400 may be a smart power amplifier. The apparatus 400 comprises a power amplifier (PA) 410 configured to receive a radio frequency (RF) input signal, RFin, for example via an input port 402 as shown in FIG. 4. A first directional coupler 404 is configured to extract a sample of the RF input signal RFin. The PA 410 is configured to produce a PA output signal, shown in FIG. 4 as RFout, which may be provided via an output port 406. A second directional coupler 408 is configured to extract a sample of the PA output signal. The PA output signal is an amplified version of the RF input signal. In an implementation including a plurality of apparatuses 400 each producing a PA output signal, RFout may be based on one or more of the plurality of PA output signals. A plurality of sensors 420 are in communication with the PA 410 and configured to perform sampling, such as asynchronous statistical sampling, of the RF input signal and of the PA output signal. The plurality of sensors 420 are also configured to generate sensor outputs.

A controller 430 is in communication with the plurality of sensors 420, and configured to obtain the sensor outputs and to infer performance of the PA 410. The apparatus 400 may include a communication interface 432, such as MIPI (Mobile Industry Processor Interface) or SPI (Serial Parallel Interface), configured to enable communication between the PA and the rest of the wireless communication system and to provide a control input to the controller 430. In the example embodiment of FIG. 4, the controller 410 comprises a function estimator 432, which may comprise machine learning elements. In the example embodiment of FIG. 4, the controller 410 comprises diagnostics 434, such as a diagnostics module, configured to perform diagnostics with respect to the PA 410 and based on the sensor outputs and the inferred performance of the PA. The controller 430 may provide one or more outputs, including bias and/or parameters, to the PA 410. In an embodiment, the one or more outputs may be used to control gain and phase of the RF output for the purpose of beamforming for Massive MIMO. In another embodiment, the one or more outputs may be used to control one or more independently controllable amplifying elements within the PA, as will be described in relation to FIG. 5 and FIG. 6.

Figure 5:
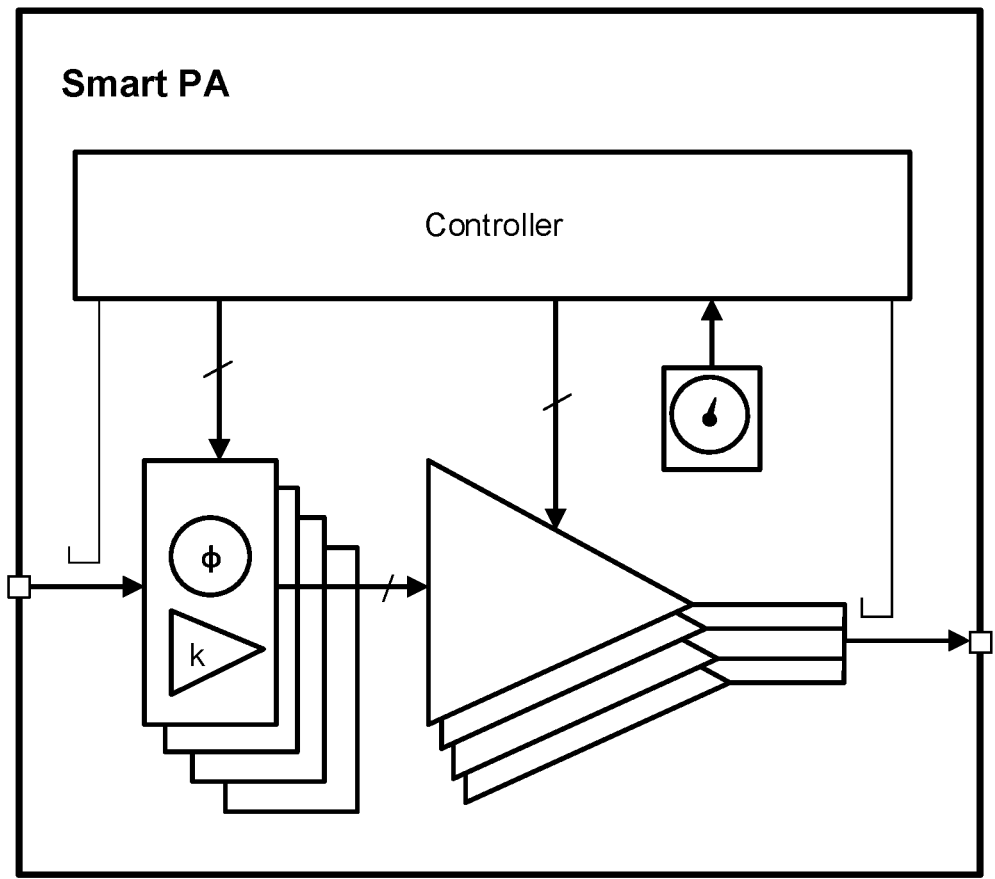
FIG. 5 is a functional block diagram illustrating an apparatus, in accordance with one or more embodiments, such as a smart power amplifier including a reconfigurable PA.

FIG. 5 is a functional block diagram illustrating an apparatus, in accordance with one or more embodiments, such as a smart power amplifier including a reconfigurable PA. In an embodiment, in addition to the elements shown in FIG. 5, the apparatus comprises: a power amplifier configured to receive a radio frequency input signal and to produce a PA output signal, the PA output signal being an amplified version of the RF input signal; a sensor subsystem configured to perform asynchronous statistical sampling of the RF input signal and of the PA output signal and to generate a sensor subsystem output; and a controller, in communication with the sensor subsystem, configured to obtain the sensor subsystem output and to infer performance of the PA based on the sensor subsystem output.

In the embodiment of FIG. 5, the PA comprises a reconfigurable PA including a plurality of independently controllable amplifying elements having associated therewith a plurality of internal control parameters. The plurality of independently controllable PA elements may be implemented in an integrated circuit. The controller may be implemented in the integrated circuit.

The controller in FIG. 5 is in communication with the plurality of independently controllable amplifying elements and configured to control one or more of the plurality of internal control parameters such that the PA is an internally reconfigurable PA. The reconfigurable PA of FIG. 5 is specifically designed to have granular control over internal parameters of the PA itself. This is in contrast to known approaches which use a "black box" PA in relation to which parameters may not be controlled. This is also in contrast to known approaches which perform preprocessing in front of a DAC, without changing anything in the PA itself. In an implementation, the reconfigurable PA of FIG. 5 provides a multiplicity of control mechanisms to optimize its performance.

In an implementation of the embodiment of FIG. 5, performance of the PA is based on a combination of contributions from the plurality of independently controllable amplifying elements. The controller of FIG. 5 may be configured to concurrently optimize performance of the PA with respect to the plurality of internal PA parameters. In an embodiment, the controller is configured to concurrently optimize performance of the PA with respect to linearity, efficiency and reliability.

In an implementation, the plurality of independently controllable PA elements in FIG. 5 comprise an independently controllable first PA element having a first internal PA parameter and an independently controllable second PA element having a second internal PA parameter. In such a case, the controller may be configured to control one or more of the first internal PA parameter and the second internal PA parameter.

In an embodiment, the controller of FIG. 5 comprises one or more integrated machine learning (ML) elements configured to modify one or more of the plurality of internal control parameters based on inferred performance metrics associated with the PA. In an embodiment, the one or more integrated ML elements are configured to perform multivariate optimization with respect to the plurality of internal PA control parameters, or with respect to a subset of the plurality of internal PA parameters.

The one or more integrated ML elements may comprise a neural network that is pre-trained to determine how to control a selected internal PA parameter from among the plurality of internal PA parameters. The neural network may be pre-trained to determine whether the selected internal PA parameter is to be increased or decreased. The one or more integrated ML elements may comprise a neural network that is pre-trained to determine how to control a selected internal PA parameter from among the plurality of internal PA parameters, and that is configured to be continuously trained to provide a recommended control modification based on one or more detected performance measures.

The one or more integrated ML elements may comprise a neural network which is configured to be trained on-chip to provide a recommended control modification based on one or more detected performance measures.

In an implementation, the RF input signal in FIG. 5 is unpreprocessed with respect to compensation for PA distortion. This is in contrast to known approaches which perform preprocessing in front of a DAC, without changing anything in the PA itself.

Figure 6:
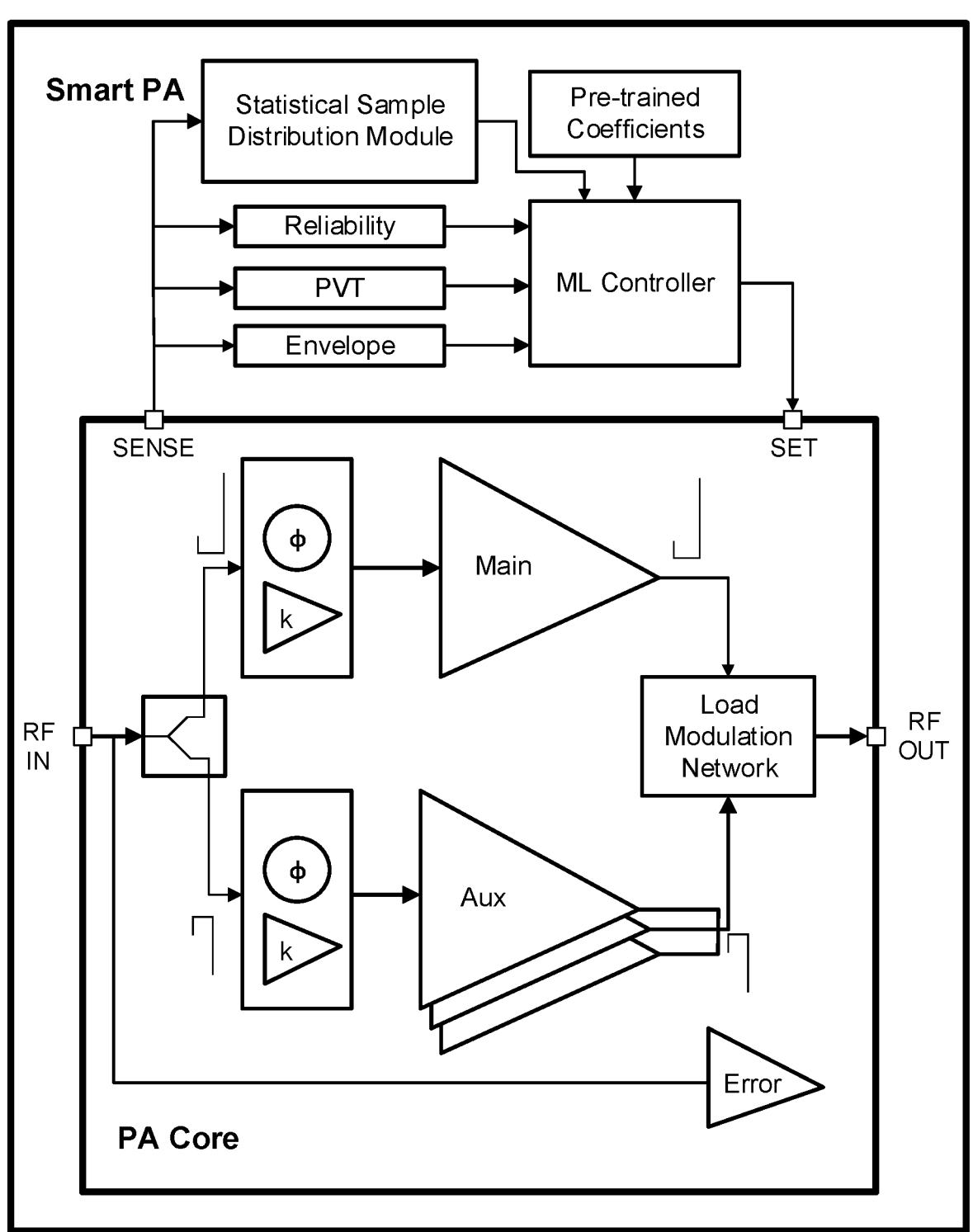
FIG. 6 is a functional block diagram illustrating another apparatus, in accordance with one or more embodiments, such as a smart power amplifier including a reconfigurable PA.

FIG. 6 is a functional block diagram illustrating another apparatus, in accordance with one or more embodiments, such as a smart power amplifier including a reconfigurable PA. The embodiment of FIG. 6 illustrates a PA core similar to the apparatus in FIG. 4 and in FIG. 5. The PA core in the embodiment of FIG. 6 additionally includes a main PA element, one or more auxiliary PA elements, and a load modulation network in communication with the main PA element and the one or more auxiliary PA elements. Each of the main PA and the auxiliary PAs may have independent phase and gain parameters, which get combined in the load modulation network. Gain and phase are examples of the parameters that may be controlled. The apparatus as shown in FIG. 6 may comprise an error amplifier, which is another element that has controllable aspects. The apparatus of FIG. 6 comprises a sensing port configured to sense one or more parameters, such as RF signals, supply voltage and current, temperature, etc. The apparatus of FIG. 6 also comprises a setting port, for setting one or more of gains, phases, biases, etc., and illustrates a number of different example elements that may be provided as part of the apparatus but outside of the PA core.

The apparatus of FIG. 6 may comprise a machine language (ML) controller module, which is configured to provide one or more outputs to the setting port, for example for use in setting one or more of gains, phases, biases, etc. The ML controller module may be configured to receive one or more inputs from: an envelope module, a PVT (CMOS process-, voltage-, and temperature) module, a reliability module and a statistical sample distribution module. Embodiments of the present disclosure provide a novel approach in providing the envelope, PVT and reliability values as an input to a neural network. The ML controller module may also be configured to receive as an input pre-trained coefficients for the ML functionality performed by the ML controller.

The ML controller of FIG. 6 may be configured to control the parameters of the plurality of independently controllable PA elements to optimize performance of the apparatus. The plurality of independently controllable PA elements may be fundamental building blocks which, when combined together to produce a smart PA, provide more degrees of freedom for control than any one of the elements on its own. The apparatus as shown in FIG. 6 may be a smart PA, which may be implemented as a system, such as a power amplifier system-on-a-chip that includes a plurality of independently controllable PA elements.

As described herein, the present disclosure provides a wireless communication system, for example a smart power amplifier, which includes a PA, and a sensor subsystem configured to perform sampling, such as asynchronous statistical sampling, of the RF input signal and of the PA output signal and to generate a sensor subsystem output. A controller, in communication with the sensor subsystem, is configured to obtain the sensor subsystem output and to infer performance of the PA, rather than the more complicated and expensive approach of measuring performance. The controller may include a neural network processor to associate a particular statistical input/output characterization with a particular inferred performance for the PA. Compared to known approaches, the system is scalable to meet Massive MIMO and bandwidth requirements, achieves lower power consumption, and is configured to obtain information about linearity performance.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

Embodiments of the disclosure can be represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a compact disk read only memory (CD-ROM), digital versatile disk (DVD), Blu-ray Disc Read Only Memory (BD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor or other suitable processing device, and can interface with circuitry to perform the described tasks.

The above-described embodiments are intended to be examples only. Alterations, modifications and variations can be effected to the particular embodiments by those of skill in the art without departing from the scope, which is defined solely by the claims appended hereto.

Embodiments of the disclosure can be described with reference to the following CLAUSES, with specific features laid out in the dependent clauses.

In an embodiment, the present disclosure provides a power amplifier (PA) comprising: a plurality of independently controllable PA elements having associated therewith a plurality of internal PA parameters, each of the plurality of independently controllable PA elements having a respective internal PA parameter; and a controller, in communication with the plurality of independently controllable PA elements, configured to control one or more of the plurality of internal PA parameters such that the PA is an internally reconfigurable PA In another embodiment, the present disclosure provides a self-optimizing power amplifier (PA) comprising: a power amplifier configured to receive a radio frequency (RF) input signal, the PA comprising a plurality of independently controllable amplifying elements having associated therewith a plurality of internal control parameters; a sensor subsystem configured to perform asynchronous statistical sampling of the RF input signal and to generate a sensor subsystem output; and a controller, in communication with the sensor subsystem and with the plurality of independently controllable PA elements, configured to: obtain the sensor subsystem output and to infer performance of the power amplifier (PA), and control one or more of the plurality of internal control parameters such that the PA is an internally reconfigurable PA.

In a further embodiment, the present disclosure provides a self-optimizing power amplifier (PA) comprising: a power amplifier configured to receive a radio frequency (RF) input signal, the PA comprising a plurality of independently controllable amplifying elements having associated therewith a plurality of internal control parameters; a sensor subsystem configured to perform sampling of the RF input signal and to generate a sensor subsystem output; and a controller, in communication with the sensor subsystem and with the plurality of independently controllable PA elements, configured to: obtain the sensor subsystem output and to infer performance of the power amplifier (PA), and control one or more of the plurality of internal control parameters such that the PA is an internally reconfigurable PA.

In another embodiment, the present disclosure provides a self-optimizing power amplifier (PA) comprising: a power amplifier configured to receive a radio frequency (RF) input signal, the PA comprising a plurality of independently controllable amplifying elements having associated therewith a plurality of internal control parameters; a sensor subsystem configured to perform sampling of the RF input signal and to generate a sensor subsystem output; and a controller, in communication with the sensor subsystem and with the plurality of independently controllable PA elements, configured to: obtain the sensor subsystem output and to infer performance of the power amplifier (PA), generate a PA performance indicator based on the inferred performance of the PA, and control one or more of the plurality of internal control parameters such that the PA is an internally reconfigurable PA.

The invention claimed is:

1. A wireless communication system comprising:
a power amplifier (PA) configured to receive a radio frequency (RF) input signal and to produce a PA output signal, the PA output signal being an amplified version of the RF input signal;

a sensor subsystem configured to perform asynchronous statistical sampling of the RF input signal and of the PA output signal and to generate a sensor subsystem output; and a controller comprising a function estimator, the controller in communication with the sensor subsystem and configured to obtain the sensor subsystem output and to infer performance of the PA based on the sensor subsystem output.

2. The system of claim 1 wherein the sensor subsystem is configured to simultaneously sample the PA output signal and the RF input signal comprising sampling the RF input signal at a first time and sampling the PA output signal at a second time, wherein the second time is equal to the first time plus a delay corresponding to the delay introduced by the PA.

3. The system of claim 2 wherein the sensor subsystem is configured to determine a difference between the sample of the RF input signal and an attenuated version of the sample of the PA output signal.

4. The system of claim 3 wherein the sensor subsystem is configured to generate the sensor subsystem output based on a statistical distribution of the difference between the sample of the RF input signal and the sample of the attenuated PA output signal.

5. The system of claim 3 wherein the sensor subsystem is configured to generate the sensor subsystem output based on a probability density measurement of the difference between the sample of the RF input signal and the sample of the PA output signal.

6. The system of claim 1 wherein the sensor subsystem is configured to perform asynchronous statistical sampling of the RF input signal and of the PA output signal at a sampling rate that is lower than the RF signal frequency.

7. The system of claim 1 wherein the sensor subsystem is configured to perform asynchronous statistical sampling of the RF input signal and of the PA output signal at a sampling rate that is about 100 times lower than the RF signal frequency.

8. The system of claim 1 wherein the sensor subsystem is configured to perform asynchronous statistical sampling to extract and preserve only a subset of the RF input signal and of the PA output signal.

9. The system of claim 1 wherein the sensor subsystem is configured to perform asynchronous statistical sampling to extract data relating to linearity and to determine statistical distribution of an amplitude of the RF input signal and the PA output signal.

10. The system of claim 1 wherein the sensor subsystem is configured to perform asynchronous statistical sampling to obtain distributions of amplitude and phase of the RF input signal and the PA output signal to determine linearity performance.

11. The system of claim 1 wherein the sensor subsystem is configured to measure one or more non-RF characteristics associated with the PA, and to generate the sensor subsystem output based on one or more of the RF input, the PA output and the one or more non-RF characteristics.

12. The system of claim 11 wherein the one or more non-RF characteristics comprise one or more of: temperature, supply voltage, average supply current, average output current, output power and signal envelope.

13. The system of claim 1 wherein the sensor subsystem comprises one or more integrated sensors co-located with the PA.

14. The system of claim 13 wherein the wireless communication system comprises an on-chip system, and wherein the one or more integrated sensors are co-located with the PA on-chip.

15. The system of claim 1 wherein the function estimator comprises one or more integrated machine learning (ML) elements configured to infer performance metrics associated with the PA.

16. The system of claim 1 wherein the function estimator comprises a neural network processor configured to implement a neural network supervised-learning performance estimation method.

17. The system of claim 16 wherein the neural network processor is pre-trained to associate a particular statistical input/output characterization with a particular inferred performance for the PA.

18. The system of claim 16 wherein the neural network processor and the sensor subsystem cooperate to create a plurality of statistical input/output characterizations and to train the neural network processor to associate a particular statistical input/output characterization with a particular inferred performance for the PA.

19. The system of claim 16 wherein the neural network processor is trained to generate a first inferred performance for the PA based on a first statistical input/output characterization, which is based on the sensor subsystem output, and based on training data.

20. The system of claim 1 wherein the controller is configured to control internal elements of the power amplifier.

21. The system of claim 1 wherein the controller is configured to provide performance information associated with the inferred performance of the PA to the system.

22. The system of claim 1 wherein the controller is configured to generate an inferred PA performance indicator based on the inferred performance of the PA.

23. The system of claim 22 wherein the generated performance indicator comprises a value or a performance category.

24. The system of claim 22 wherein generating the performance indicator may comprise one or more of: generating a performance indication signal embedding performance indication data; generating performance indication data; and/or generating a visual performance indicator.

25. A wireless communication system comprising:
a reconfigurable power amplifier (PA) configured to receive a radio frequency (RF) input signal and to produce a PA output signal, the PA output signal being an amplified version of the RF input signal, the reconfigurable PA including a plurality of independently controllable amplifying elements having associated therewith a plurality of internal control parameters;
a sensor subsystem configured to perform asynchronous statistical sampling of the RF input signal and of the PA output signal and to generate a sensor subsystem output; and
a controller, in communication with the sensor subsystem, configured to obtain the sensor subsystem output and to infer performance of the PA based on the sensor subsystem output,
wherein the controller is in communication with the plurality of independently controllable amplifying elements and configured to control one or more of the plurality of internal control parameters such that the PA is an internally reconfigurable PA.

26. The system of claim 25 wherein performance of the PA is based on a combination of contributions from the plurality of independently controllable amplifying elements.

27. The system of claim 25 wherein:
the plurality of independently controllable PA elements comprise an independently controllable first PA element having a first internal PA parameter and an independently controllable second PA element having a second internal PA parameter; and
the controller is configured to control one or more of the first internal PA parameter and the second internal PA parameter.

28. The system of claim 25 wherein the controller is configured to concurrently optimize performance of the PA with respect to the plurality of internal PA parameters.

29. The system of claim 28 wherein the controller is configured to concurrently optimize performance of the PA with respect to linearity, efficiency and reliability.

30. The system of claim 25 wherein the controller comprises one or more integrated machine learning (ML) elements configured to modify one or more of the plurality of internal control parameters based on inferred performance metrics associated with the PA.

31. The system of claim 30 wherein the one or more integrated ML elements are configured to perform multivariate optimization with respect to the plurality of internal PA control parameters.

32. The system of claim 30 wherein the one or more integrated ML elements are configured to perform multivariate optimization with respect to a subset of the plurality of internal PA parameters.

33. The system of claim 30 wherein the one or more integrated ML elements comprise a neural network that is pre-trained to determine how to control a selected internal PA parameter from among the plurality of internal PA parameters.

34. The system of claim 33 wherein the neural network is pre-trained to determine whether the selected internal PA parameter is to be increased or decreased.

35. The system of claim 30 wherein the one or more integrated ML elements comprise a neural network that is pre-trained to determine how to control a selected internal PA parameter from among the plurality of internal PA parameters, and that is configured to be continuously trained to provide a recommended control modification based on one or more detected performance measures.

36. The system of claim 30 wherein the one or more integrated ML elements comprise a neural network which is configured to be trained on-chip to provide a recommended control modification based on one or more detected performance measures.

37. The system of claim 25 wherein:
the RF input signal is unpreprocessed with respect to compensation for PA distortion.

38. The system of claim 25 wherein the plurality of independently controllable PA elements are implemented in an integrated circuit.

39. The system of claim 38 wherein the controller is implemented in the integrated circuit.

40. A processor-implemented method for processing instructions associated with one or more data transfers, the method comprising:
receiving, at a power amplifier (PA), a radio frequency (RF) input signal;
producing, at the PA, a PA output signal, the PA output signal being an amplified version of the RF input signal;

performing, via a sensor subsystem, asynchronous statistical sampling of the RF input signal and of the PA output signal and to generate a sensor subsystem output; and obtaining, via a controller comprising a function estimator, the sensor subsystem output and inferring performance of the PA based on the sensor subsystem output, the controller being in communication with the sensor subsystem.

41. The method of claim 40 further comprising:

generating, via the controller, an inferred PA performance indicator based on the inferred performance of the PA.

42. An apparatus comprising:

a non-transient computer-readable storage medium having executable instructions embodied thereon; and one or more hardware processors configured to execute the instructions to perform the method of claim 40.

43. A wireless communication system comprising:

a power amplifier (PA) configured to receive a radio frequency (RF) input signal and to produce a PA output signal, the PA output signal being an amplified version of the RF input signal;

a sensor subsystem configured to perform sampling of the RF input signal and of the PA output signal and to generate a sensor subsystem output; and a controller comprising a function estimator, the controller in communication with the sensor subsystem and comprising one or more integrated machine learning (ML) elements and configured to obtain the sensor subsystem output and to infer performance metrics associated with the PA based on the obtained sensor subsystem output the controller.

44. The system of claim 43 wherein the controller is configured to generate an inferred PA performance indicator based on the inferred performance of the PA.

45. A power amplifier (PA) comprising:

a plurality of independently controllable PA elements having associated therewith a plurality of internal PA parameters, each of the plurality of independently controllable PA elements having a respective internal PA parameter; and a controller, in communication with the plurality of independently controllable PA elements, configured to control one or more of the plurality of internal PA parameters based on asynchronous statistical sampling of an RF input signal to the PA and a PA output signal such that the PA is an internally reconfigurable PA, wherein the PA output signal comprises an amplified version of the RF input signal.

* * * * *